United States Patent [19]

Kawasaki

[11] Patent Number: 5,144,156
[45] Date of Patent: Sep. 1, 1992

[54] PHASE SYNCHRONIZING CIRCUIT WITH FEEDBACK TO CONTROL CHARGE PUMP

[75] Inventor: Takeshi Kawasaki, Suwa, Japan

[73] Assignee: Seiko Epson Corporation, Tokyo, Japan

[21] Appl. No.: 716,686

[22] Filed: Jun. 17, 1991

[30] Foreign Application Priority Data

Jun. 15, 1990 [JP] Japan .................................. 2-157044
Jun. 15, 1990 [JP] Japan .................................. 2-157045
Apr. 1, 1991 [JP] Japan .................................. 3-68115

[51] Int. Cl.$^5$ .......................... H03K 5/13; H03K 5/00
[52] U.S. Cl. .................... 307/262; 307/269; 328/155; 331/17
[58] Field of Search ............... 307/262, 269, 514, 510; 328/155; 331/1 A, 17

[56] References Cited

U.S. PATENT DOCUMENTS

| | | | |
|---|---|---|---|
| 4,523,150 | 6/1985 | Hogeboom | 307/514 |
| 4,675,617 | 6/1987 | Martin | 331/1 A |
| 4,814,726 | 3/1989 | Byrd et al. | 331/1 A |
| 5,021,749 | 6/1991 | Kasai et al. | 328/155 |
| 5,055,803 | 10/1991 | Hietala | 331/17 |

Primary Examiner—Stanley D. Miller
Assistant Examiner—Toan Tran
Attorney, Agent, or Firm—Spensley, Horn, Jubas & Lubitz

[57] ABSTRACT

In a semiconductor phase synchronizing circuit, variations in specific frequency and damping factor due to unavoidable variations in manufacturing conditions are prevented so that variations in phase synchronizing characteristics from one product to another are reduced. A charge pump of the phase synchronizing circuit is provided with a proportional charging electric current source and a proportional discharging electric current source arranged to be in the form of a feedback loop and to pass to a loop filter charging/discharging electric currents which are proportional to a converted electric current (output electric current) of a V/I converting circuit. The proportional charging electric current source is a P-type MOSFET, while the proportional discharging electric current source is an N-type MOSFET. The charge pump is a current mirror circuit in front of which a current mirror circuit of the V/I converting circuit is disposed.

9 Claims, 5 Drawing Sheets

PHASE SYNCHRONIZING CIRCUIT WITH FEEDBACK TO CONTROL CHARGE PUMP

BACKGROUND OF THE INVENTION

The present invention relates to a phase synchronizing circuit for generating a clock which is synchronized with, and follows up the phase of, an input signal, and more particularly, to a phase synchronizing circuit exhibiting an excellent phase synchronizing characteristic and capable of being applied to zone bit recording for use in a hard disc system or the like.

Hitherto, the structure of a phase synchronizing circuit widely used in a data separator or a frequency multiplexing circuit of a magnetic disc apparatus has been arranged as shown in FIG. 7 to include a phase comparator 10 for performing a comparison between the phase of an input signal $S_{IN}$, which is a reference signal, and that of an oscillator output signal $V_{OUT}$, at the oscillator frequency $f_{osc}$ from, a voltage controlled oscillator 40 so as to output a delayed phase difference detection signal $Q_1$ and a leading phase difference detection signal $Q_2$, and a charge pump 20 for supplying charging/discharging electric currents to a capacitor $C_F$ of an RC loop filter 30 in accordance with the delayed phase difference detection signal $Q_1$ and the leading phase difference detection signal $Q_2$. The loop filter 30 which is a low-pass filter (LPF) constitutes a lag lead filter which provides a filter output voltage $V_F$ which controls the frequency $f_{osc}$ of the oscillator output voltage $V_{OUT}$, which corresponds to the value of the above-described input. The voltage controlled oscillator 40 is constituted by a voltage-current converting circuit (hereinafter called a "V/I converting circuit) 42 and a current-frequency converting circuit (hereinafter called an "I/F converting circuit) 44. The oscillating frequency $f_{osc}$ of the voltage controlled oscillator 40 may be supplied to the phase comparator 10 via a predetermined divider.

The phase comparator 10 is a digital phase comparator which is constituted by, for example, a pair of D flip-flops and a logic gate. The charge pump 20 is, as shown in FIG. 8, a series circuit constituted by an insulating-gate field effect transistor (hereinafter called a "MOSFET") 22 which is turned on to supply a charging current $i_1$ in response to a low level value of the delayed phase difference detection signal $Q_1$, a charging electric current source 24, a MOSFET 26 which is turned on to supply a discharging current $i_2$ in response to a high level value of the leading phase difference detection signal $Q_2$, and a discharging electric current source 28.

As shown in FIG. 9, the charging fixed electric current source 24 and the discharging fixed electric current source 28 are respectively constituted by current mirror circuits. The value of the charging electric current and that of the discharging current are both equal to the value of a mirror electric current $i_1$ which is determined in accordance with the value of a charging/discharging electric current value setting resistor $R_x$.

FIG. 10 illustrates an embodiment of V/I converting circuit 42. This circuit is constituted by a voltage-electric current converting portion 42a for varying the value of an electric current $i_3$ in accordance with the value of the filter output voltage $V_F$ and a current mirror circuit 42b for deriving an output electric current $i_3$ from input electric current $i_3$. The converted electric current $i_3$ in the voltage-electric current converting portion 42a of V/I converting circuit 42 is represented by the following equation:

$$i_3 = (V_{DD} - V_F)/R_Y \qquad (1)$$

where $R_Y$ is a converted electric current value setting resistance of an op-amp OP in portion 42a and $V_{DD}$ is the power supply voltage for circuit 42.

However, a phase synchronizing circuit constituted as described above is associated with the following problems:

(1) When the phase synchronizing circuit is constituted by a semiconductor integrated circuit, the characteristics of the transistors which constitute the phase synchronizing circuit exhibit substantial differences from one another due to the manufacturing process. Therefore, the current-frequency conversion coefficient k of I/F converting circuit 44 inevitably has a different value in each product. That is, if the I/F converting circuits 44 of two phase synchronizing circuits have respective conversion coefficients k and k+δk, they receive respective electric currents $i_3$ and $i_3+δi_3$ when the input signal $S_{IN}$ and the oscillator frequency $f_{osc}$ of VCO 40 are synchronized with each other. However, since the charge pump 20 charges/discharges the loop filter 30 with the fixed electric currents supplied from the fixed electric current sources 24 and 26, the closed loop gain G of the phase synchronizing circuit inevitably varies considerably between products. The variations in gain G will cause corresponding variations in the specific frequency $\omega_n$ and in the damping factor $\zeta$ which characterize the phase synchronizing circuit. Consequently, the yield of the semiconductor phase synchronizing circuits deteriorates.

(2) On the other hand, the electric elements of the circuits are arranged to have the most suitable values in order to synchronize the phase with the input signal $S_{IN}$ at a special frequency. For example, the value of the charging/discharging electric current $i_1$ of the charge pump 20, the time constant of the loop filter 30 and the I/F characteristic are determined in the above-described manner. When the frequency of the input signal $S_{IN}$ is switched to a different value, also the frequency component such as the jitter is changed. As a result, it is necessary to perform an adjustment to again give each of the parameters of the above-described circuit elements the most suitable value.

Specifically, in a case where clocks having different frequencies are applied as the input signal after they have been switched, it is necessary to preliminarily provide a plurality of loop filters having different time constants to switch to the most suitable loop filter so as to synchronize with the frequency switching. That is, input signals having different frequencies must be received by the corresponding loop filters provided. For example, in a case where zone bit recording is realized in a hard disc system, a plurality of loop filters must be used, causing the structure of the phase synchronizing circuit to be unduly complicated. Therefore, calculations must be performed to give the circuit constant the most suitable value for each of the frequencies of the input signals.

SUMMARY OF THE INVENTION

In order to overcome the above-described problem, a first object of the present invention is to provide a phase synchronizing circuit capable of preventing the change in the specific frequency and the damping factor associated with the inevitable change in the current-frequency conversion coefficient due to variations in the manufacturing process.

A second object of the present invention is to provide a phase synchronizing circuit which is able to achieve the first-stated object and which is capable of establishing a phase synchronizing characteristic with which correspondence to the input signals, which have been changed, can be made in a case where input signals having different frequencies are switched and applied to a single loop filter.

Similar to the structure of a conventional phase synchronizing circuit, the phase synchronizing circuit according to the present invention has phase comparison means, charge pump means, loop filter means, voltage-current converting mean, and current-frequency converting means. The phase comparison means performs a comparison between the phase of a first input signal, which is a reference signal, and that of a second input signal which is in accordance with the oscillation signal output from the current-frequency converting means so as to output its phase difference detection signal. The charge pump means passes a drive current to charge or discharge the loop filter means in accordance with the phase difference detection signal. The voltage-current converting means has a converted electric current value setting resistor and generates a converted electric current which is substantially in proportion to the difference between the output voltage from the loop filter means and the power supply voltage in accordance with the value of the converted electric current value setting resistor. The current-frequency converting means transmits, as a supply source of a clock signal, the oscillator output at the oscillator frequency which is substantially in proportion to the value of the converted electric current. The voltage-current converting means and the current-frequency converting means constitute voltage controlled oscillator means.

In order to achieve the above-described object, the first means of the structure according to the abovedescribed embodiment is arranged in such a manner that a feedback loop is used as a proportional electric current source for passing an electric current with a value proportional to the value of the converted electric current of the voltage-current converting means, in place of a structure arranged in such a manner that the electric current source for the driving current in the charge pump means is arranged to be the fixed electric current source.

The specific structure of the phase comparison means is arranged to have a first flip-flop having a clock input connected to receive either the first input signal or the second input signal and which outputs a delayed phase difference detection signal, a second flip-flop having a clock input connected to receive the other one of the first input signal and the second input signal and which outputs a leading phase difference detection signal, and a logic circuit which receives as two inputs the delayed phase difference detection signal and the leading phase difference detection signal and which generates reset signals for the first and second flip-flops.

The phase comparison means thus constituted has a proportional electric current source the specific structure of which is arranged to have a proportional charging electric current source for passing a charging drive current which is substantially in proportion to the value of the converted electric current, in response to the generation of the delayed phase difference detection signal, and a proportional discharging electric current source for passing a discharging drive current which is substantially in proportion to the value of the converted electric current, in response to the generation of the leading phase difference detection signal.

On the other hand, the specific structure of the voltage-current converting means is arranged to have a voltage-current converting portion for generating an input electric current which corresponds to the value of the converted electric current value setting resistor and a current mirror circuit for obtaining, as the converted electric current, a mirror electric current which has substantially the same value as the input electric current of the voltage-current converting portion. The proportional charging electric current source and the proportional discharging electric current source can be constituted in the form of current mirror circuits with the current mirror circuit disposed in front.

In order to achieve the above-described second object, the second means of the present invention has loop filter means comprising first capacitor means disposed between an output terminal and a source of a first power supply voltage, second capacitor means disposed between the output terminal and a source of a second power supply voltage, and capacitance ratio varying control means for changing the capacitance ratio of the first and second capacitor means in response to the generation of the phase difference detection signal while maintaining the total capacitance of the first and second capacitor means. The first capacitor means is specifically structured to have fixed-connection capacitor means connected between the output terminal and the first power supply voltage source and switching-connection capacitor means which are switched to be connected between the output terminal and the first or second power supply voltage source. The second capacitor means has a fixed-connection capacitor means connected between the output terminal and the second power supply voltage source and switching connection capacitor means which are switched to be connected between the output terminal and the second or first power supply voltage source. On the other hand, the capacitance varying control means are specifically structured to be switching means for switching and connecting the switching connection capacitor means. It is preferable that the phase synchronizing circuit is a semiconductor integrated circuit in the form of one chip.

In the above-described phase synchronizing circuit, the current-frequency conversion coefficient of the voltage-current converting means inevitably varies among products due to manufacturing variations. However, since the loop filter is subjected to charging/discharging with the drive electric current, which is substantially in proportion to the converted electric current of the voltage-current converting circuit disposed at the front of the voltage-current converting means, the closed loop gain G is related to the converted electric current while adhering to a relationship which is in proportion to the current-frequency conversion coefficient.

On the other hand, as can be clearly seen from the characteristics of the current-frequency converting circuit, the oscillator frequency is the same in all of the phase synchronizing circuits in a state where synchronization is established between the input signal and the oscillator frequency. Therefore, the closed loop gain G does not vary even when variations occur in the current-frequency conversion coefficient. This means that the specific frequency $\omega_n$ and the damping factor $\zeta$ are not changed. Therefore, the phase synchronizing characteristics of the phase synchronizing circuits can be equalized, causing an improvement in the yield of circuits having acceptable phase synchronizing characteristics. Thus, a certain product is able to assuredly possess stability with regard to its phase synchronizing characteristic as a function of temperature change.

In a case where the loop filter means comprises first capacitor means disposed between the output terminal and the first power supply voltage source, second capacitor means disposed between the output terminal and the second power supply voltage source and capacitance ratio varying control means for changing the capacitance ratio of the first and second capacitor means in response to the generation of the phase difference detection signal while maintaining the total capacitance of the first and second capacitor means, a gap-like voltage change quantity is first generated at the output terminal in response to the generation of the phase difference detection signal. This corresponds to the magnitude of the voltage drop across the resistor in the conventional loop filter. Then, a relatively moderate voltage change takes place at the output terminal due to the drive current of the charge pump. Therefore, the loop filter having no resistor and constituted by only the capacitor means is substantially the same as the conventional structure. By using the thus arranged loop filter, the characteristics of following in synchronization with input signals having different frequencies can be improved. That is, the oscillating frequency and the specific frequency $\omega_n$ are able to automatically follow up in proportion to the frequency of the input signal by switching the value of the converted current value setting resistor in inverse proportion to its frequency. That is, the lock-in range can be widened. Furthermore, the damping factor $\zeta$ can be maintained at a predetermined value. As a result, the necessity of providing a plurality of different loop filters can be eliminated and the structure can be applied to an apparatus employing zone bit recording or the like simply by switching to converted electric current value setting resistors having different values.

Preferred embodiments of the present invention will now be described with reference to the drawings.

DESCRIPTION OF THE PREFERRED EMBODIMENTS

Figure 1:
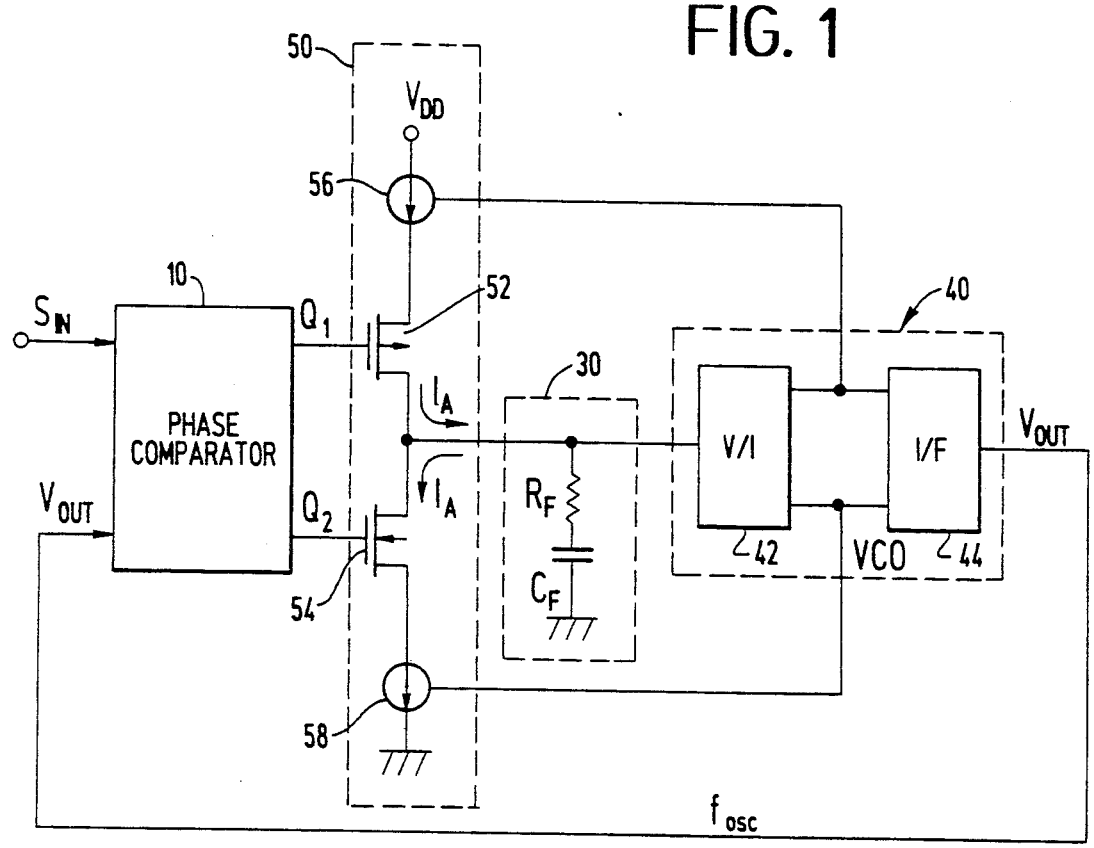
FIG. 1 is a block diagram which illustrates a first embodiment of a phase synchronizing circuit according to the present invention.

FIG. 1 is a block diagram which illustrates a first embodiment of a phase synchronizing circuit according to the present invention. The phase synchronizing circuit according to this embodiment is constituted by a phase comparator 10, a charge pump 50, a loop filter 30 and a voltage controlled oscillator 40 which is composed of a V/I converting circuit 42 and an I/F converting circuit 44.

The phase comparator 10 effects a comparison between the phase of an input signal $S_{IN}$, which serves as a reference signal, and the phase of the output signal $V_{out}$ from the voltage controlled oscillator 40 so as to output a delayed phase difference detection signal $Q_1$ and a leading phase difference detection signal $Q_2$.

Figure 2:
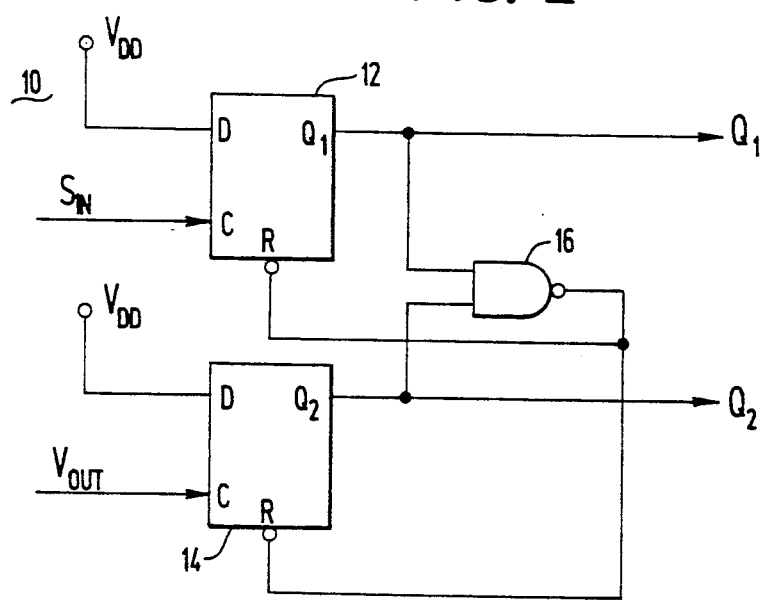
FIG. 2 is a circuit diagram which illustrates an embodiment of a phase comparator utilized in the circuit of FIG. 1.

As shown in FIG. 2, phase comparator 10 is constituted by a D flip-flop 12 which receives the input signal $S_{IN}$ as a clock input and outputs the delayed phase difference detection signal $Q_1$, a D flip-flop 14 which receives the oscillation output $V_{out}$ as a clock input and outputs the leading phase difference detection signal $Q_2$ and a NAND gate 16 which receives the two detection signals $Q_1$ and $Q_2$ so as to generate the reset signal for the two D flip flops 12 and 14.

The charge pump 50 is a series circuit constituted by a switching MOSFET 52 for controlling the flow of a charging current and a switching MOSFET 54 for controlling the flow of discharging current. MOSFET 52 is switched on in response to the low level delayed phase difference detection signal $Q_1$. MOSFET 54 is switched on in response to the high level leading phase difference detection signal $Q_2$. A proportional charging current source 56 supplies the charging current at a level which is proportional to the output current from the V/I converting circuit 42 and a proportional discharging current source 58 supplies the discharging current at a level which is proportional to the output current from V/I converting circuit 42. The proportional charging current source 56 is a P-type MOSFET, while the proportional discharging current source 58 is an N-type MOSFET.

The loop filter 30 serving as a low range, or low pass, filter constitutes a lag lead filter which is equivalent in terms of a circuit correlation with respect to the charge pump 50, the loop filter 30 being an equivalent series circuit comprising a resistor $R_F$ and a capacitor $C_F$.

Figure 3:
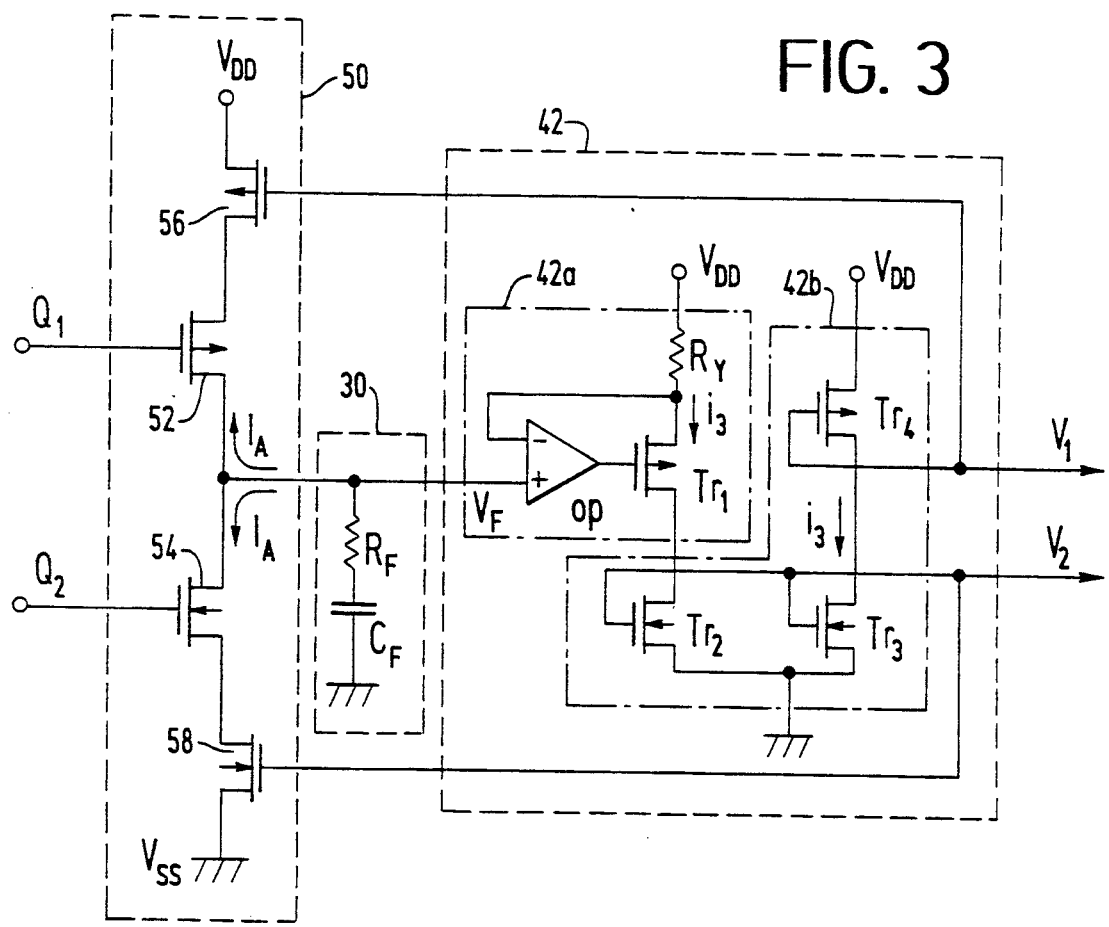
FIG. 3 is a circuit diagram which illustrates an embodiment of a charge pump and a voltage-current converting circuit utilized in the circuit of FIG. 1.

The V/I converting circuit 42 of the voltage controlled oscillator 40 is constituted, as shown in FIG. 3, by a voltage-current converting portion 42a for changing the value of input current $i_3$ in accordance with the level of filter output voltage $V_F$ and a current mirror circuit 42b for producing an output current $i_3$ which is identical to the input current. The converted current $i_2$ is defined by Equation (1) as in the case of the conventional structure.

Transistors $Tr_2$ and $Tr_3$ included in V/I converting circuit 42 constitute a current mirror circuit, while the current amplification factor of the transistor $Tr_3$ is the same as that of transistor $Tr_4$. Therefore, the mirror current passing through the transistors $Tr_3$ and $Tr_4$ is made to be the same as the input current $i_3$. On the other hand, the MOSFET which is the proportional charging current source 56 of charge pump 50, is gate-controlled by output signal $V_1$. However, since the physical channel width of the gate of MOSFET 56 and that of transistor $Tr_4$ can be made the same, they have essentially the same operating characteristics. As a result, the charging current is the same as the current $i_3$. Similarly, the MOSFET 58 of the proportional discharging current source of the charge pump 50 is gate-controlled with the output signal $V_2$. However, since the channel width of the gate of the MOSFET 58 and that of the transistor $Tr_3$ can be made the same, they can have the same characteristics.

According to this embodiment, the transistors are manufactured to have the same shape for the purpose of simplifying the semiconductor manufacturing process. However, by arranging the channel width of the MOSFET 56 to be n times that of the transistor $Tr_4$ and arranging the channel width of MOSFET 58 to be n times that of the transistor $Tr_3$, the value of the charging current and that of the discharging current can be respectively set to n times the value of the output current $i_3$.

Therefore, if the charging and discharging currents are designated generally by $I_A$, $I_A$ can be represented as follows:

$$I_A = n \cdot i_3 \tag{2}$$

Figure 4:
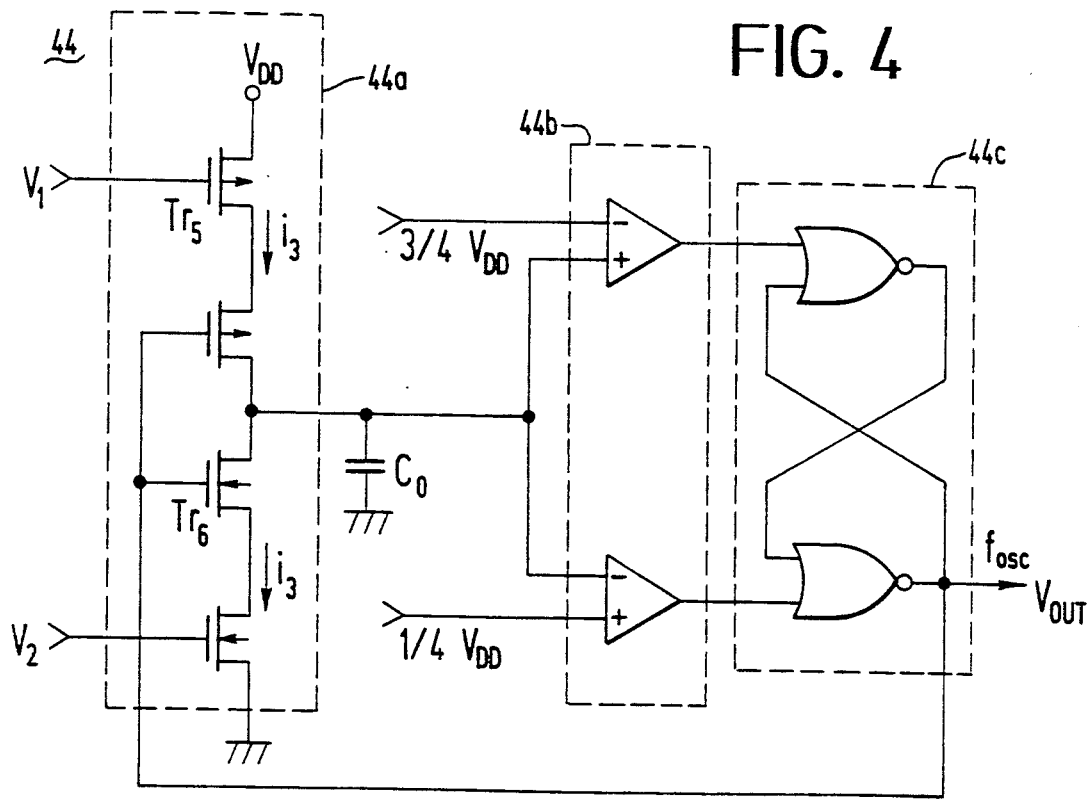
FIG. 4 is a circuit diagram which illustrates an embodiment of a current-frequency converting circuit utilized in the circuit of FIG. 1.

The I/F converting circuit 44 of voltage controlled oscillator 40 comprises a known ring oscillator circuit structured as shown in FIG. 4 and including a charging/discharging constant current source circuit 44a, a capacitor $C_o$, a pair of comparators 44b and a flip-flop circuit 44c composed of a pair of NOR gates. Circuit 44 is a self-excited oscillator for charging/discharging the capacitor $C_o$ via constant current sources, processing a sawtooth waveform from the potential of the capacitor $C_o$ by the pair of comparators 44b and shaping it to form a rectangular wave by the action of flip-flop circuit 44c. Since a transistor $Tr_5$ of the charging/discharging constant current source circuit 44a and the transistor $Tr_4$ of the V-I converting circuit 42 are made identical, the charging/discharging current to and from capacitor $C_o$ is the same as the current $i_3$. Therefore, with regard to the characteristics of the I/F converting circuit 44, the following equation is deduced from the fact that the oscillator output signal frequency $f_{osc}$ is proportional to the input current $i_3$:

$$f_{osc} = k \cdot i_3 \tag{3}$$

where k is the current-frequency conversion coefficient.

Then, substitution of Equation (1) into Equation (3) yields $$f_{osc} = k(V_{DD} - V_F)/R_Y \tag{4}$$

The above-described equation shows the relationship between the input voltage $V_F$ of VCO 40 and the oscillator output signal frequency $f_{osc}$. The value of the resistor $R_Y$ is usually established so as make a desired oscillator center frequency correspond to $V_F = V_{DD}/2$. Modification of Equation (4) yields:

$$f_{osc}/(V_{DD} - V_F) = k/R_Y \tag{5}$$

Therefore, the voltage-frequency conversion coefficient ($\delta f_{osc}/\delta V_F$) is given by the absolute value of $k/R_Y$. The voltage-frequency conversion coefficient is usually expressed in radian units. Therefore, the voltage-frequency conversion coefficient can be expressed in radian units as:

$$K_v = 2\pi k/R_Y [rad/V \cdot sec] \tag{6}$$

Furthermore, since the charging/discharging current (drive current) of the charge pump 50 controlled by phase difference detection signals $Q_1$ and $Q_2$ outputted from the digital phase comparator 10 is $I_A$, a conversion coefficient $K_c$ which includes the contribution of phase comparator 10 and charge pump 50 can, as is well known, be expressed as follows:

$$K_C = I_A/2\pi [A/rad] \tag{7}$$

Substitution of Equation (2) into Equation (7) yields:

$$K_C = n i_2/2\pi [A/rad] \tag{8}$$

Therefore, the closed loop gain G of the phase synchronizing circuit is given by the following equation, derived from Equations (7) and (8)

$$G(k) = K_c \times K_v = n \cdot k \cdot i_3/R_Y \tag{9}$$

The closed loop transfer function H (S) of a secondary loop such as the phase synchronizing circuit according to the present invention which uses a lag lead filter as the loop filter 30 is, as is well known, expressed as follows:

$$H(S) = \frac{(2 \zeta \omega_n + \omega_n^2)}{(S^2 + 2 \zeta \omega_n S + \omega_n^2)} \tag{10}$$

where $\omega_n$ is a specific frequency of the loop and $\zeta$ is a damping factor, which can be expressed respectively as follows:

$$\omega_n = (G/C_F)^{\frac{1}{2}} \tag{11}$$

where $C_F$ is a constant, and $$\zeta = \omega_n C_F R_F/2 \tag{12}$$

The above-described values determine the characteristics of the phase synchronizing circuit. Therefore, it is preferable that the value of the specific frequency $\omega n$ and that of the damping factor $\zeta$ not be influenced even if the characteristics of, for example, the transistor fluctuate, or vary, during the process of manufacturing a batch or series of nominally identical semiconductor devices.

Now a case where the conversion coefficient k of the I/F converting circuit 44 has been changed due to variations occurring in the manufacturing process will be considered. In a state (of a lock-in operation) where the oscillator frequency $f_{osc}$ is synchronized with the same input signal $S_{IN}$, for two circuits which have the respective conversion coefficients k and $(k + \delta k)$ output an oscillator frequency $f_{osc}$ having the same value. Therefore, the following relationship can be obtained from Equation (3):

$$f_{osc} = k \cdot i_3 = (k + \delta k) \cdot (i_3 + \delta i_3) \quad (13)$$

where $(i_3 + \delta i_3)$ is the output current of the V-I converting circuit of the I-F converting circuit 44 which has conversion coefficient $(k + \delta k)$. On the other hand, the closed loop gain $G(k + \delta k)$ in the phase synchronizing circuit thus arranged is calculated from Equation (9) as follows:

$$G(k+\delta k) = n \cdot (k+\delta k) \cdot (i_3 + \delta i_3)/R_Y \quad (14)$$

Therefore, the quantity of change $\delta G$ in the closed loop gain is:

$$\delta G = G(k+\delta k) - G(k) = (n \cdot (k+\delta k) \cdot (i_3 + \delta i_3) - n \cdot k \cdot i_3)/R_Y \quad (15)$$

Since the numerator of the right-hand expression of Equation (15) is zero, as can be clearly seen from Equation (13), the quantity of change in the closed loop gain $\delta G = 0$. That is, even if the conversion coefficient k of the I/F converting circuit 44 has been changed due to manufacturing variations in the characteristics of the transistors, no change occurs in the closed loop gain G. Consequently, changes in the specific frequency $\omega n$ and the damping factor $\zeta$ can be prevented, as can be clearly seen from Equations (11) and (12).

As described above, according to this embodiment, since the electric current sources 56 and 58 for passing a charging/discharging electric current, which is proportional to the output electric current (mirror electric current $i_3$) of the V/I converting circuit 42, are employed in the form of a feedback loop, changes in the specific frequency $\omega n$ and the damping factor $\zeta$ can be prevented even if the conversion coefficient k of the I/F converting circuit 44 cannot be made identical in each product due to variations inherent in the manufacturing process. Therefore, the phase synchronizing characteristics of phase synchronizing circuits according to the invention can be equalized. As a result, the yield of such circuits can be improved. Furthermore, a temperature compensating function can be exhibited in the operation of such circuit.

Figure 5:
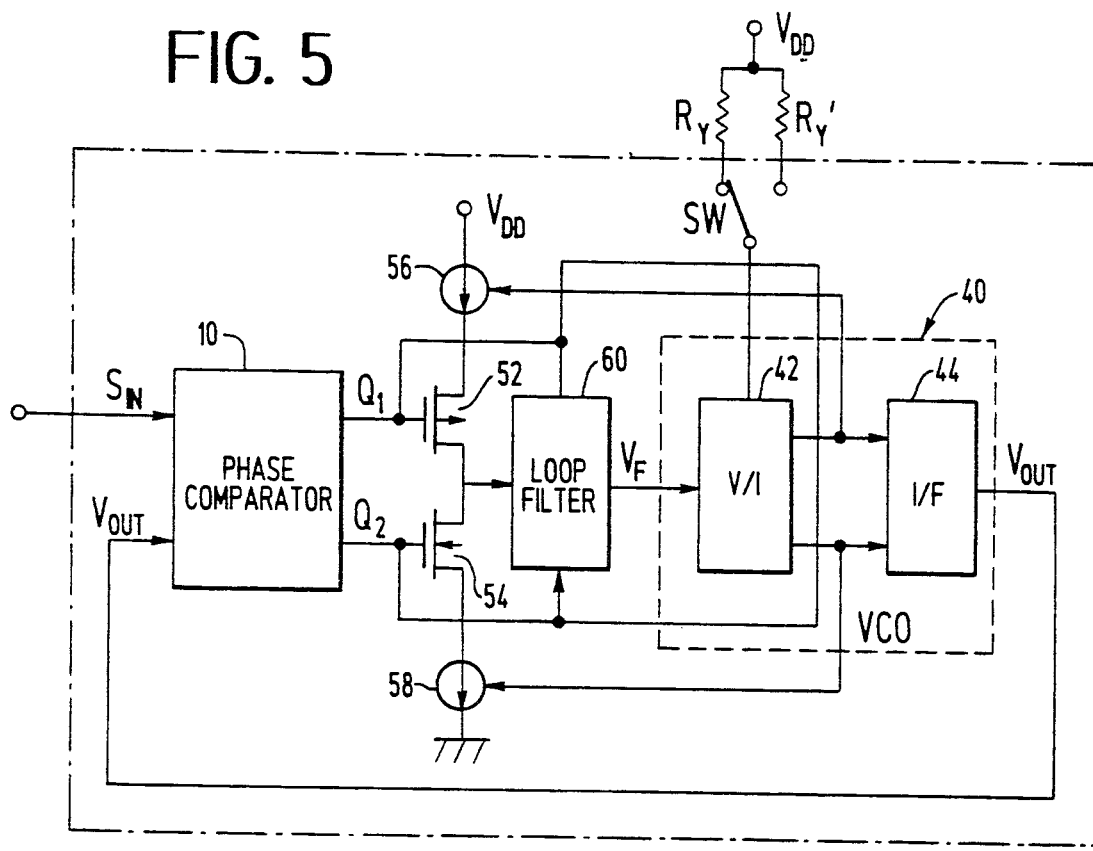
FIG. 5 is a block diagram which illustrates a second embodiment of the phase synchronizing circuit according to the present invention.
Figure 6:
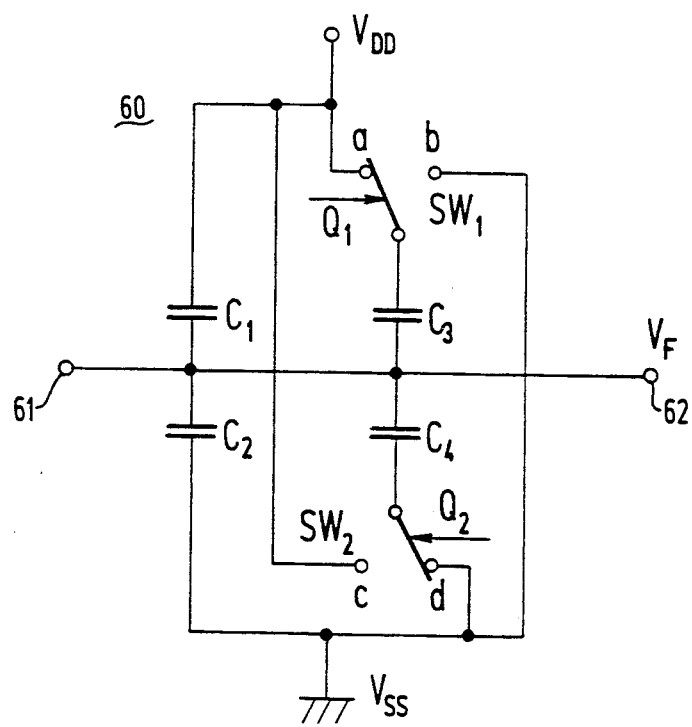
FIG. 6 is a circuit diagram which illustrates an embodiment of a loop filter utilized in the embodiment of FIG. 5.
Figure 7:
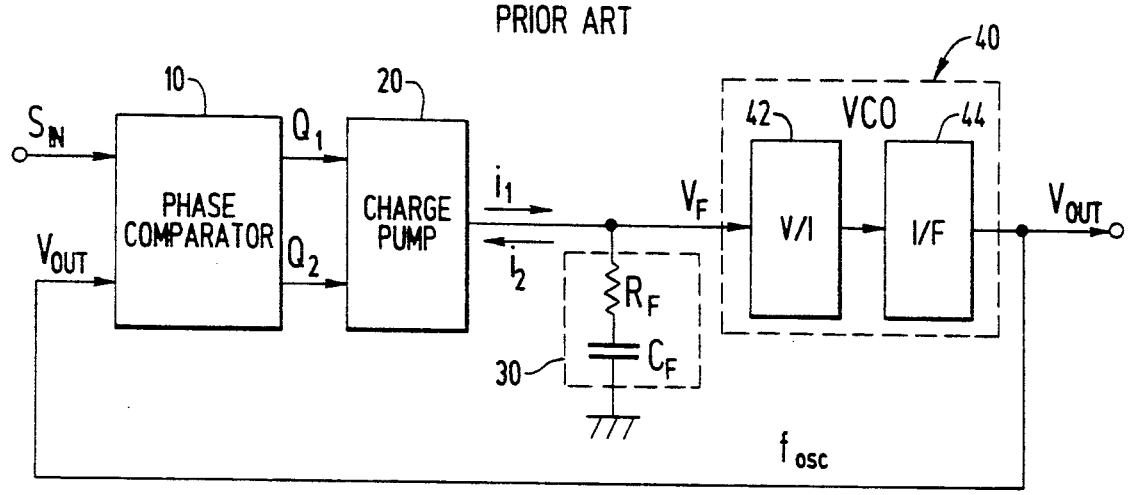
FIG. 7 is a block diagram which illustrates a conventional phase synchronizing circuit.
Figure 8:
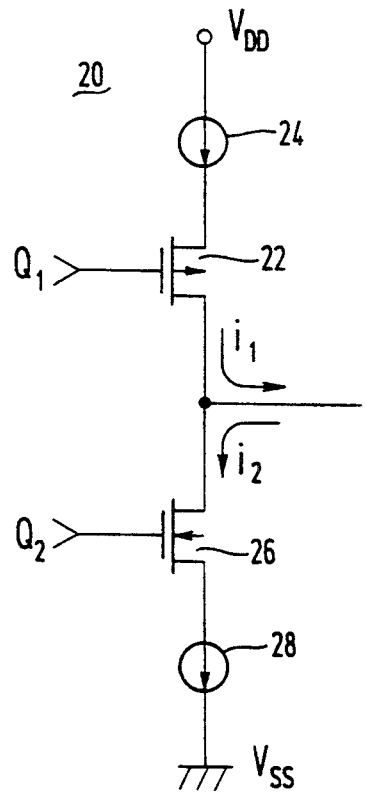
FIG. 8 is a circuit diagram which illustrates the circuit structure of a charge pump for the conventional structure of FIG. 7.

FIG. 5 is a block diagram which illustrates a second embodiment of the present invention. Also according to this embodiment, due to arrangement of the feedback loop, the electric current sources 56 and 58 supply charging and discharging currents which are proportional to the output current (converting current) from the V/I converting circuit 42, resulting in a mode of operation similar to that obtained in the first embodiment. The difference from the first embodiment lies in the structure of the loop filter 60.

Specifically, loop filter 60 is composed of a capacitor $C_1$ connected in a fixed manner between an output terminal 62 and the source of high potential $V_{DD}$, a capacitor $C_2$ connected in a fixed manner between output terminal 62 and the source of a low potential $V_{SS}(=0)$, a capacitor $C_3$ connected in a switchable manner between output terminal 62 and either the source of high potential $V_{DD}$ or the source of low potential $V_{SS}$ in accordance with the switching of a switch $SW_1$ and a capacitor $C_4$ connected in a switchable manner between output terminal 62 and either the source of high potential $V_{DD}$ or the low source of low potential $V_{SS}$ in accordance with the switching of a switch $SW_2$.

The switch $SW_1$ is switched from position a to position b when phase comparator 10 generates the delayed phase difference detection signal $Q_1$. The switch $SW_2$ is switched from position d to position c when phase comparator 10 generates the leading phase difference detection signal $Q_2$. The switches SW1 and SW2, as will be described below, constitute a variable capacitance ratio control means.

In a phase synchronizing state, the switch $SW_1$ is in position a and switch $SW_2$ is in position b.

Now, the case where the leading phase difference detection signal $Q_2$ is generated in phase comparator 10 whereby switch $SW_2$ is switched from position d to position c will be considered. Assuming that the filter output voltage $V_F$ has been changed from $V_A$ to $V_B$, the charge transfer quantity $\delta q4$ from capacitor $C_4$ before and after the switching is expressed as follows:

$$\delta q4 = C_4 \cdot (V_{DD} - V_B) - (-C_4 \cdot V_A) \quad (16)$$

Similarly, the charge transfer quantity $\delta q3$ of capacitor $C_3$ is expressed as follows:

$$\delta q3 = C_3 \cdot (V_{DD} - V_A) - C_3 \cdot (V_{DD} - V_B) \quad (17)$$

Therefore, the residual quantity of charge transfer from capacitor $C_4$ to capacitor $C_3$ can be calculated as follows from Equations (16) and (17), assuming $C_3 = C_4 = C_B$:

$$\delta q = \delta q4 - \delta q3 = C_B \cdot V_{DD} - 2C_B \cdot (V_A - V_B) \quad (18)$$

However, to derive this relationship, the assumption was made that $C_3 = C_4 = C_B$. If, in addition, $C_1 = C_2 = C_A$, the residual quantity $\delta q$ is equally distributed between capacitors $C_1$ and $C_2$. Therefore, the charge transfer quantity $\delta q2$ from capacitor $C_2$ is:

$$\delta q2 = \delta q/2 = [C_B \cdot V_{DD} - 2C_B \cdot (V_A - V_B)]/2 \quad (19)$$

Since the change $\delta V$ of the output voltage due to the introduced charge quantity $\delta q2$ is $V_b - V_A$, the following relationship exists:

$$\delta V = V_B - V_A = [C_B \cdot V_{DD} - 2C_B \cdot (V_A - V_B)]/2C \quad (20)$$

Calculation of $V_B - V_A$ from Equation (20) the following deduced result:

$$\delta V = V_B - V_A = C_B \cdot V_{DD}/[2 \cdot (C_A + C_B)] \quad (21)$$

When the loop filter 30 according to the first embodiment and composed of the resistor $R_F$ and the capacitor $C_F$ is charged/discharged by the drive current $I_A$ supplied by charge pump 50, the output voltage $V_F$ of loop filter 30 is expressed by:

$$V_F = I_A \cdot R_F + C_F^{-1} \int I_A dt \quad (22)$$

On the other hand, in a case where the similar operation is carried out in accordance with this embodiment, a gap-like voltage change quantity $\delta V$ due to the switching of switch $SW_2$ from position d to position c in response to the generation of the phase difference detection signal is generated in the voltage $V_F$. Then, the potential is changed relatively moderately with a time dependency due to the charge/discharge to and from capacitors $C_1$, $C_2$, $C_3$ and $C_4$ due to the drive current $I_A$ of charge pump 50. That is, the output voltage $V_F$ of loop filter 60 according to this embodiment is:

$$V_F = C_B \cdot V_{DD}[2 \cdot (C_A + C_B)]^{-1} + [2 \cdot (C_A + C_B)]^{-1} \int I_A dt \qquad (23)$$

Comparison between Equations (22) and (23) leads to the following relationships:

$$R_F = C_B \cdot V_{DD}/[2 \cdot (C_A + C_B) \cdot I_A] \qquad (24)$$

$$C_F = 2 \cdot (C_A + C_B) = \text{constant} \qquad (25)$$

The magnitude of the voltage drop due to $R_F$ in the first embodiment corresponds to the gap-like voltage change quantity $\delta V$ in the second embodiment due to the switching of $SW_2$ in response to the generation of the phase difference detection signal. This means that the resistor $R_F$ according to the first embodiment can be substantially replaced by the loop filter 60. Equation (24) indicates that the total capacitance of capacitors C1, C2, C3 and C4 is constant.

The above-described specific frequency $\omega n$ (for example from 10 Mbps to 15 Mbps) is usually determined in accordance with the frequency $f_{IN}$ of the input signal $S_{IN}$. That is, it is preferable that the relationship expressed by $\omega n = f_{IN}$ be held. As for the damping factor $\zeta$, engineers in the technical field which relates to phase synchronizing circuits preferably select a fixed value of $\zeta = 2^{-\frac{1}{2}} = 0.7$ regardless of the value of the frequency $f_{IN}$ of input signal $S_{IN}$. By using Equations 1 and 9, Equation 11 can be transformed as follows:

$$\omega_n = [k \cdot n \cdot (V_{DD} - V_F)/C_F]^{\frac{1}{2}}/R_Y \qquad (26)$$

The specific frequency $\omega n$ is inversely proportional to the resistance of the converted current value setting resistor $R_Y$ disposed externally to V/I conversion circuit 42. As described above, since it is preferable that the phase synchronizing circuit maintain the relationship of $\omega n = f_{IN}$, the resistance value of the external resistor $R_Y$ is selected to be inversely proportional to the frequency $f_{IN}$ of the input signal $S_{IN}$ (as shown in FIG. 5, the switch SW is switched to be connected to $R_Y$ or $R_Y'$). Therefore, when the input signal $S_{IN}$ has been, as a result, changed to a signal of a different frequency, the value of the external resistor $R_Y$ is changed in response to the above-described switching. Thus, the oscillator output frequency $f_{osc}$ of the VCO is automatically changed in proportion to the frequency $f_{IN}$ of the input signal. Furthermore, the specific frequency $\omega n$ is also automatically changed.

As for the damping factor $\zeta$, the value of the damping factor $\zeta$ is not changed if the resistance of resistor $R_Y$ is changed. That is, the specific frequency $\omega n$ is inversely proportional to the resistance of resistor $R_Y$. On the other hand, as expressed in Equations (1) and (2), $I_A$ is inversely proportional to $R_Y$ and $R_F$ is inversely proportional to $I_A$ as expressed by Equation (24). Therefore, $R_F$ is proportional to $R_Y$. As a result, since $C_F$ is a constant, the damping factor $\zeta$ is, from Equation (12), a constant regardless of the resistance value of resistor $R_Y$. Therefore, the value of the damping factor $\zeta$ is not changed if the resistance value of resistor $R_Y$ is changed.

As described above, if a clock of a different frequency is supplied as the input signal as a result of the switching, the oscillator output frequency $f_{osc}$ and the specific frequency $\omega n$ of the VCO can automatically follow up in proportion to the frequency of the input signal by switching the resistance value of the external converted current value setting resistor $R_Y$ to be in inverse proportion to the frequency of the phase difference detection signals $Q_1$ and $Q_2$ or that of the input signal in response to the generation of the zone switching signal. As a result, the so-called lockin range can be widened. Furthermore, the damping factor $\zeta$ can be maintained at a constant value. Therefore, in a phase synchronizing circuit of a hard disc apparatus or the like which employs zone bit recording (ZBR), the storage capacity of which is desired to be increased by, for example, making the data transfer rate (that is, the magnetically inverting interval) between the inner track and the outer track, the conventional necessity of providing a plurality of loop filters having different time constants can be avoided. According to this embodiment, only the switching of the converted current value setting resistors $R_Y$ and $R_Y'$ will cause the same effect to be obtained. Therefore, the number of parts constituting the loop filter can be significantly reduced. The plurality of converted current value setting resistors can, of course, be in the form of a semiconductor integrated circuit (one chip). In this case, the number of I/0 pins of the semiconductor integrated circuit can be reduced.

As described above, the present invention is characterized in that the feedback loop is used to establish a proportional electric current source for passing the electric current, the value of which is in proportion to the converted current of the voltage-current converting means, in place of a structure arranged in such a manner that the electric current source for the driving current in the charge pump means is arranged to be a fixed electric current source. Therefore, the following effects can be obtained:

(1) The closed loop gain G is linked to the converted electric current while holding a relationship which is in proportion to the current-frequency conversion coefficient. Although the electric current-frequency conversion coefficient of the voltage-electric current converting means differs from on product to another in the same production run, due to manufacturing variations, the oscillator output frequency is the same in all of the phase synchronizing circuits in a state where synchronization is established between the input signal and the oscillator output frequency due to the characteristics of the electric current-frequency converting circuit. Therefore, a change in the closed loop gain G is not produced even if the current-frequency conversion coefficient varies. As a result, the specific frequency $\omega n$ and the damping, factor $\zeta$ are not changed. Therefore, the phase synchronizing characteristics of the phase synchronizing circuits can be equalized, causing an improvement in the yield in terms of the phase synchronizing characteristics. Thus, a certain product is able to exhibit a temperature compensating function.

(2) In a case where the loop filter means is constituted by the first and second capacitor means and the capacitor ratio control means, the oscillator output frequency and the specific frequency $\omega n$ are able to automatically follow up in proportion to the frequency of the input signal by switching the resistance of the converted current value setting resistor in inverse proportion to its frequency even if an input signal having a different frequency is received. That is, the lockin range can be widened. Furthermore, the damping factor $\zeta$ can be maintained at a predetermined value. Therefore, a single loop filter can be applied to an apparatus in which zone bit recording or the like is employed after the converted electric current value setting resistor or the different resistor values have been switched. Consequently, the number of component parts and the number of circuit elements can be reduced.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A phase synchronizing circuit comprising:
   phase comparison means for effecting a comparison between the phase of a first input signal, and the phase of a second input signal so as to output a phase difference detection signal representative of the difference in phase between the first and second input signals;
   charge means connected to receive a power supply voltage for passing, in accordance with said phase difference detection signal, a drive current;
   loop filter means connected to be selectively charged or discharged by said drive current so as to produce an output voltage;
   voltage-electric current converting means operative for generating a converted electric current in response to the output voltage of said loop filter means; and
   electric current-frequency converting means for producing an oscillator output signal at a frequency which is in response to the value of said converted electric current, as a source of the second input signal,
   wherein said charge means has a controlled electric current source for said drive current which supplies an electric current in response to said converted electric current.

2. A phase synchronizing circuit according to claim 1 wherein said controlled electric current source comprises: a proportional charging electric current source for providing a charging drive current which is substantially proportional to the value of said converted electric current in response to the generation of a delayed phase difference detection signal from said phase comparison means; and a proportional discharging electric current source for passing a discharging drive current which is substantially proportional to the value of said converted electric current in response to the generation of a leading phase difference detection signal from said phase comparison means.

3. A phase synchronizing circuit according to claim 2 wherein said phase comparison means comprise: a first flip-flop having a clock input connected to receive one of said first input signal and second input signal, a reset input and an output for providing said delayed phase difference detection signal; a second flip-flop having a clock input connected to receive the other one of said first input signal and second input signal, a reset input and an output for providing said leading phase difference detection signal; and a logic circuit connected to receive the delayed phase difference detection signal and the leading phase difference detection signal and for producing reset signals and conducting the reset signals to said reset inputs of said first and second flip-flops.

4. A phase synchronizing circuit according to claim 2 wherein said voltage-electric current converting means has a converted electric current value setting resistor, a voltage-electric current converting portion for generating an input electric current which corresponds in value to the resistance of said converted electric current value setting resistor, and a first current mirror circuit for providing, as said converted electric current, a mirror electric current which has substantially the same magnitude as the input electric current of said voltage-electric current converting portion.

5. A phase synchronizing circuit according to claim 4 wherein said proportional charging electric current source and said proportional discharging electric current source are constituted as further current mirror circuits connected to said first current mirror circuit.

6. A phase synchronizing circuit comprising:
   phase comparison means for effecting a comparison between the phase of a first input signal, and the phase of a second input signal so as to output a phase difference detection signal representative of the difference in phase between the first and second input signals;
   means supplying a first power supply potential and a second power supply potential, the difference between the potentials being a power supply voltage;
   charge means connected to receive the power supply voltage for passing, in accordance with said phase difference detection signal, a drive current;
   loop filter means connected to be selectively charged or discharged by said drive current so as to produce an output voltage;
   voltage-electric current converting means comprising a converted electric current value setting resistor and operative for generating a converted electric current which is in response to the output voltage of said loop filter means; and
   electric current-frequency converting means for producing an oscillator output signal at a frequency which is in response to the value of said converted electric current, as a source of the second input signal, wherein
   said charge means has an electric current source for said drive current which passes an electric current which is substantially proportional to said converted electric current, and
   said loop filter means comprise: an output terminal for supplying the output voltage; first capacitor means connected between said output terminal and a point at the first power supply potential; second capacitor means connected between said output terminal and a point at the second power supply potential; and capacitance ratio varying control means for changing the capacitance ratio between said first and second capacitor means in response to the generation of said phase difference detection signal while maintaining the total capacitance of said first and second capacitor means.

7. A phase synchronizing circuit according to claim 6 wherein: said first capacitor means comprises a first capacitor permanently connected between said output terminal and the point at the first power supply potential, and a second capacitor means switchably connected between said output terminal and a point at one of the first and second power supply potentials; and said second capacitor means comprises a third capacitor permanently connected between said output terminal and the point at the first power supply potential, and a fourth capacitor means switchably connected between said output terminal and a point at one of the first and second power supply potentials.

8. A phase synchronizing circuit according to claim 7 wherein said capacitance ratio varying control means comprise switching means for switching the connections of said second and fourth capacitors to the points at the first and second power supply potentials.

9. A phase synchronizing circuit according to claim 1 wherein said phase synchronizing circuit is a semiconductor integrated circuit on a single integrated circuit chip.

* * * * *

UNITED STATES PATENT AND TRADEMARK OFFICE
CERTIFICATE OF CORRECTION

PATENT NO. : 5,144,156

DATED : September 1, 1992

INVENTOR(S) : Takeshi Kawasaki

Figure 9:
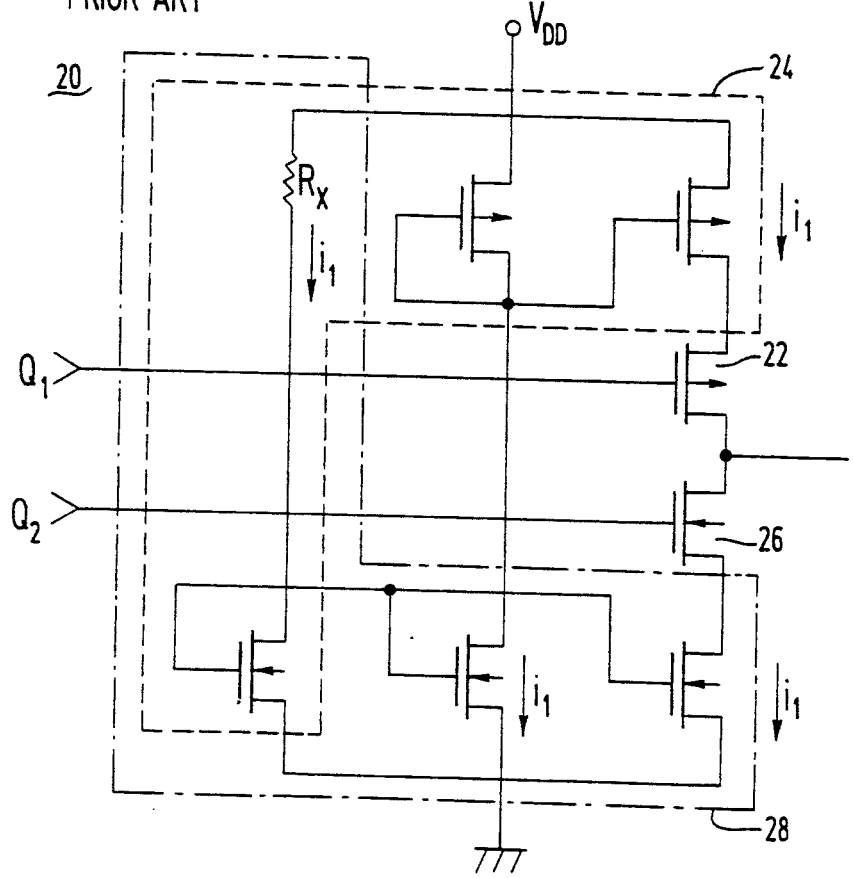
FIG. 9 is a circuit diagram which illustrates in detail an embodiment of the charge pump of FIG. 8.
Figure 10:
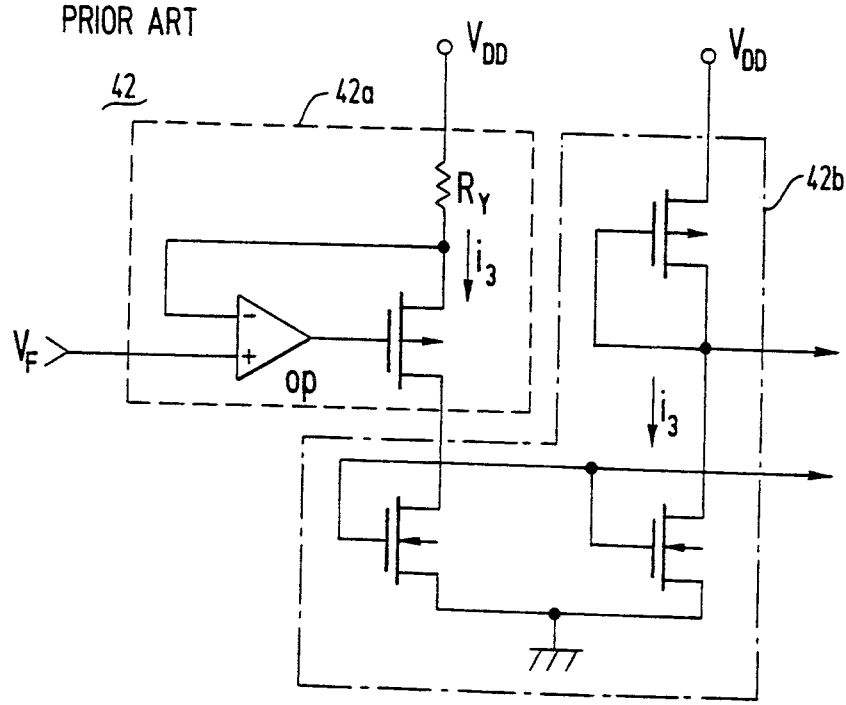
FIG. 10 is a circuit diagram which illustrates an embodiment of the voltage-current converting circuit of the conventional structure of FIG. 7.

It is certified that error appears in the above-identified patent and that said Letters Patent is hereby corrected as shown below:

In the Drawings, Figures 3, 9 and 10 should be deleted, and substitute therefor the attached Figures.

Signed and Sealed this

Twenty-first Day of September, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,144,156
DATED : September 1, 1992
INVENTOR(S) : TAKESHI KAWASAKI

Page 2 of 4

It is certified that error appears in the above—identified patent and that said Letters Patent is hereby corrected as shown below:

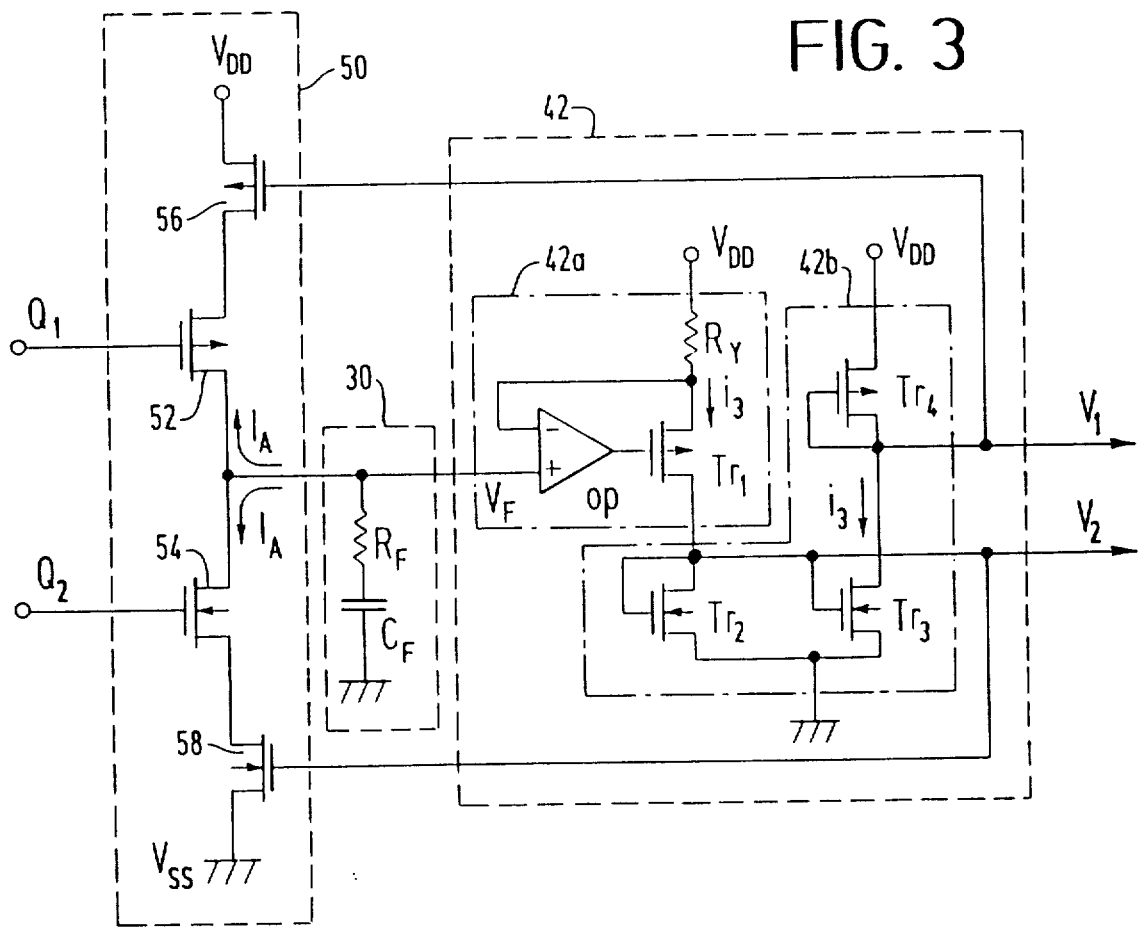

FIG. 3

UNITED STATES PATENT AND TRADEMARK OFFICE
CERTIFICATE OF CORRECTION

PATENT NO. : 5,144,156
DATED : September 1, 1992
INVENTOR(S) : TAKESHI KAWASAKI

It is certified that error appears in the above—identified patent and that said Letters Patent is hereby corrected as shown below:

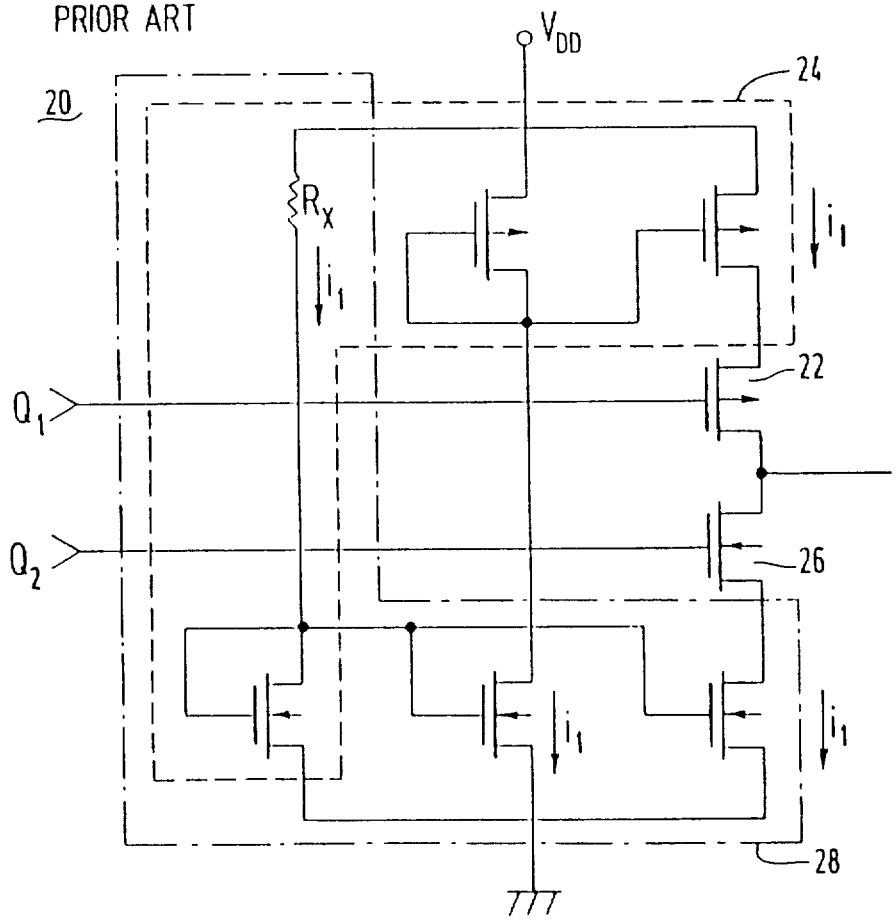

FIG. 9
PRIOR ART

UNITED STATES PATENT AND TRADEMARK OFFICE
CERTIFICATE OF CORRECTION

PATENT NO. : 5,144,156
DATED : September 1, 1992
INVENTOR(S) : TAKESHI KAWASAKI

It is certified that error appears in the above—identified patent and that said Letters Patent is hereby corrected as shown below:

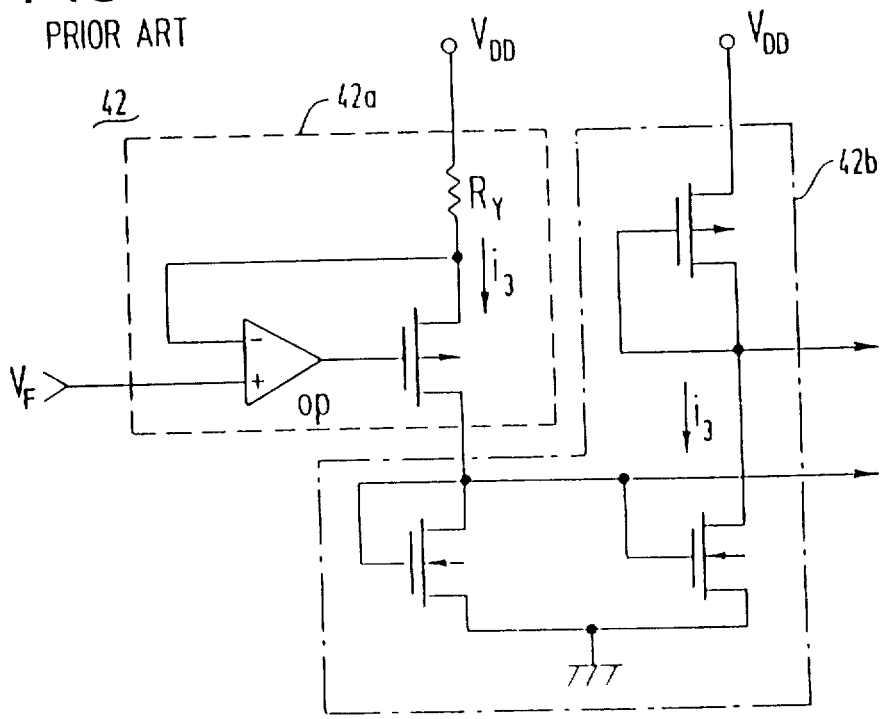

FIG. 10
PRIOR ART